(12) United States Patent
Roy et al.

(10) Patent No.: US 9,767,875 B2
(45) Date of Patent: Sep. 19, 2017

(54) CAPACITIVE SENSING AND REFERENCE VOLTAGE SCHEME FOR RANDOM ACCESS MEMORY

(71) Applicant: FREESCALE SEMICONDUCTOR, INC., Austin, TX (US)

(72) Inventors: Anirban Roy, Austin, TX (US); Thomas Jew, Austin, TX (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 14/823,825

(22) Filed: Aug. 11, 2015

(65) Prior Publication Data

US 2017/0047101 A1    Feb. 16, 2017

(51) Int. Cl.
*G11C 11/16* (2006.01)
*G11C 29/02* (2006.01)

(52) U.S. Cl.
CPC ........ *G11C 11/1673* (2013.01); *G11C 29/026* (2013.01); *G11C 29/028* (2013.01)

(58) Field of Classification Search
CPC .................................................. G11C 11/1673
See application file for complete search history.

(56) References Cited

U.S. PATENT DOCUMENTS

| | | |
|---|---|---|
| 6,191,989 B1 | 2/2001 | Luk et al. |
| 8,027,206 B2 | 9/2011 | Yoon et al. |
| 8,194,439 B2 | 6/2012 | Kim et al. |
| 8,509,003 B2 | 8/2013 | Lin et al. |
| 8,687,412 B2 | 4/2014 | Chih et al. |
| 2009/0160882 A1* | 6/2009 | Kiya ............ G09G 3/2007 345/690 |
| 2011/0122674 A1 | 5/2011 | Lin et al. |
| 2012/0319727 A1* | 12/2012 | Katti ............ H03K 19/16 326/38 |
| 2014/0211550 A1 | 7/2014 | Sun et al. |
| 2014/0269031 A1* | 9/2014 | Jung ............ G11C 11/1673 365/158 |
| 2015/0063012 A1* | 3/2015 | Jung ............ G11C 7/06 365/158 |
| 2015/0070978 A1* | 3/2015 | Kim ............ G11C 11/1659 365/158 |

OTHER PUBLICATIONS

Zhang et al, "Design and analysis of the reference cells for STT-MRAM", IEICE Electronics Express, May 2013, pp. 1-6, vol. 10, No. 12.

(Continued)

*Primary Examiner* — Richard Elms
*Assistant Examiner* — Jerome Leboeuf (57) ABSTRACT

A method uses a memory that includes a plurality of non-volatile memory (NVM) cells; a plurality of word lines; a plurality of bit lines; and an amplifier having an inverting input, a non-inverting input, and an output; and a capacitance coupled to the inverting input includes. A reference is coupled to the non-inverting input. The output of the amplifier is coupled to the inverting input of the amplifier while the non-inverting input receives the reference. The output is decoupled from the inverting input to store a voltage on the inverting input of the amplifier. A non-volatile (NV) element of a first NVM cell of the plurality of NVM cells is coupled to the non-inverting input. An output signal representative of the state of the NVM cell is provided.

19 Claims, 5 Drawing Sheets

(56) References Cited

OTHER PUBLICATIONS

Yu et al, "New Circuit Design Architecture for a 300-MHz 40nm 1Mb Embedded STT-MRAM with Great Immunity to PVT Variation", International Conference on Solid-State and Integrated Circuit (ICSIC), 2012, pp. 57-61, vol. 32.
Xu et al, "Design of Spin-Torque Transfer Magnetoresistive RAM and CAM/TCAM with High Sensing and Search Speed", IEEE Transactions on Very Large Scale Integration (VLSI) Systems, Jan. 2010, pp. 66-74, vol. 18, No. 1.
Tsuchida et al, "A 64Mb MRAM with Clamped-Reference and Adequate-Reference Schemes", IEEE International Solid-State Circuits Conference Digest, Feb. 2010, pp. 258-260.
Smullen, "Designing Giga-scale Memory Systems with STT-RAM", PhD Thesis dissertation, University of Virginia, 2011, pp. 1-144.
Na et al, "Reference-Scheme Study and Novel Reference Scheme for Deep Submicrometer STT-RAM", IEEE Transactions on Circuits and Systems—I: Regular Papers, Apr. 2014, pp. 1-10.
Huang et al, "Optimization Scheme to Minimize Reference Resistance Distribution of Spin-Transfer-Torque MRAM", IEEE Transactions of Very Large Scale Integration (VLSI) Systems, May 2014, pp. 1179-1182, vol. 22, No. 5.
Chen et al, "A Nondestructive Self-Reference Scheme for Spin-Transfer Torque Random Access Memory (STT-RAM)", Design, Automation & Test in Europe Conference & Exhibition (DATE), Mar. 8-12, 2010, pp. 148-153, Dresden.
Aoki et al, "A Novel Voltage Sensing 1T/2MTJ Cell with Resistance Ratio for Highly Stable and Scalable MRAM", Symposium on VLSI Circuits Digest of Technical Papers, 2005, pp. 170-171.

\* cited by examiner

CAPACITIVE SENSING AND REFERENCE VOLTAGE SCHEME FOR RANDOM ACCESS MEMORY

BACKGROUND

Field

This disclosure relates generally to integrated circuits, and more particularly, to sensing and reference voltage schemes for one transistor one resistor (1T1R) random access memory (RAM) cells.

Related Art

As voltages used in memory devices for modern consumer electronics are ever decreasing, traditional techniques for sensing voltage or current to read the state of memory cells become inadequate. In particular, for memory cells that use only 1 transistor and 1 resistor (1T1R), the difference between voltage or current being sensed during a read operation may be within the same order of magnitude as any bias or offset that may be present due to offset error in sense amplifiers of the memory device. Further, it is desirable to keep voltages used during read operations below a level that might change the state of a memory cell. Due to small differences in currents and low voltages during read operations, it is challenging to sense the state of memory cells quickly in a power efficient manner. Due to low voltage, current sensing may be used, but errors in current mirrors can give inaccurate results.

Accordingly there is a need to provide further improvement in sensing 1T1R RAM cells.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Embodiments of memory devices and methods disclosed herein provide random access memory (RAM) devices with one transistor/one resistor memory cells that use spin transfer torque magnetic tunnel junction (STT MTJ) resistive elements with a reference cell configuration to provide equal read voltage margin for data with values of both '0' and '1'. The configuration also avoids disturbing the state of the memory cells during read operations. Reference and data bit lines are connected in series during read operations so the same current is sent through resistors for the reference and the data, thereby avoiding the need for current mirroring. A differential sense amplifier is configured to cancel offset during a calibration phase so that voltages sensed during read operations are free of any offset errors that may be caused by mismatch of input devices in the sense amplifier. The freedom from offset errors allows accurate sensing of even small voltages, thus providing improved sense amplifiers for low voltage memory devices.

Figure 1:
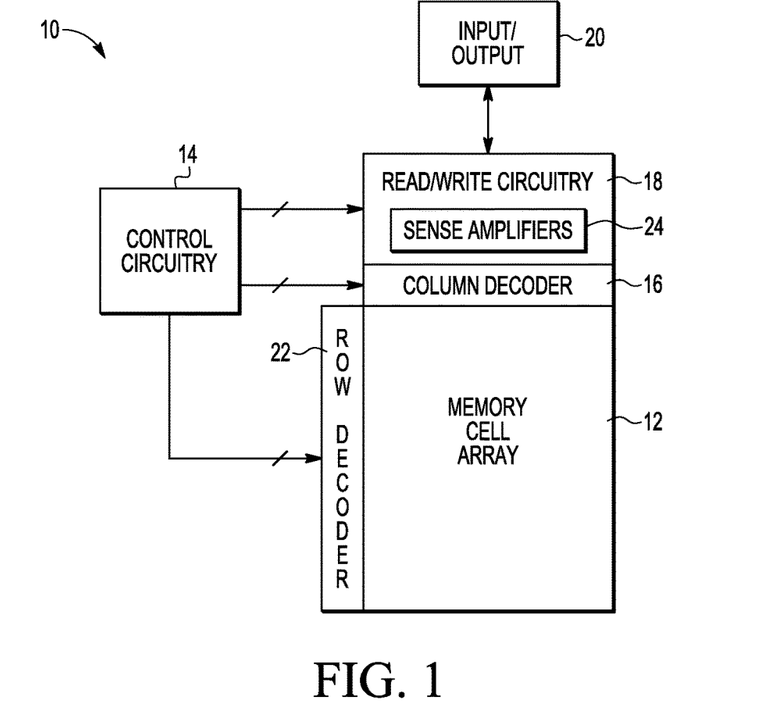
FIG. 1 illustrates a block diagram of an embodiment of a RAM device.

Shown in FIG. 1 is a block diagram of an embodiment of a RAM device 10 having a memory cell array 12, control circuitry 14, a column decoder 16 coupled to array 12 and control circuitry 14, read/write circuitry 18 coupled to the column decoder 16 and input/output circuitry 20, and a row decoder 22 coupled to array 12 and control circuitry 14. Array 12 is accessed under the control of control circuitry 14 which directs the operations of row decoder 22, column decoder 16, and read/write circuitry 18. Control circuitry 14 provides addresses and control signals for this purpose. Memory cells in array 12 are selected for reading or writing with output from row decoder 22 and column decoder 16. Read/write circuitry 18 performs the reading and writing. Input/output 20 provides data signals to read/write circuitry 18 and receives data signals from read/write circuitry 18. Read/write circuitry 18 includes one or more sense amplifiers 24 coupled to column decoder 16 to sense the voltage on bit lines coupled to the memory cells in array 12 during read operations.

Figure 2:
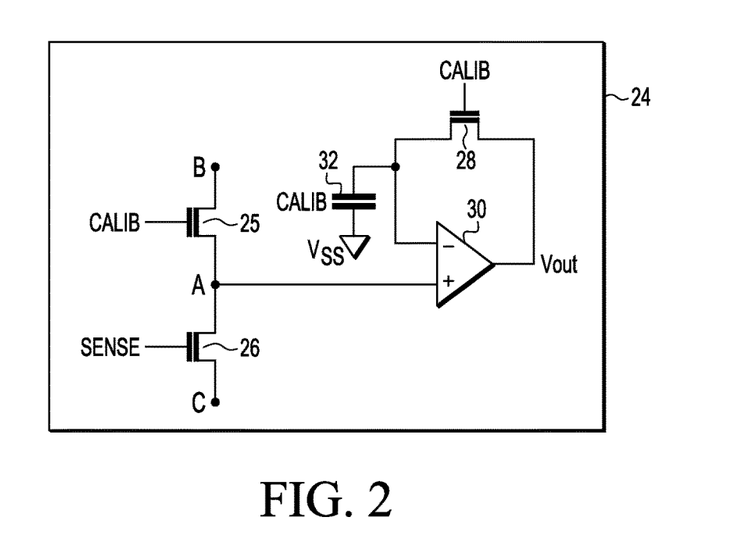
FIG. 2 illustrates a circuit diagram of an embodiment of a sense amplifier of the RAM device of FIG. 1.

FIG. 2 illustrates a circuit diagram of an embodiment of a sense amplifier 24 of the RAM device 10 of FIG. 1 that includes calibration transistors 25, 28, sense transistor 26, differential amplifier 30, and calibration capacitor 32. Calibration transistor 25 includes a first current electrode coupled to node B, a second current electrode coupled to node A, and a control electrode coupled to a calibration enable (CALIB) signal that is used to control operation of transistor 25 during a calibration mode. Sense transistor 26 includes a first current electrode coupled to node A, a second current electrode coupled to node C, and a control electrode coupled to a sense enable (SENSE) signal that is used to control operation of transistor 26 during a sense mode. A non-negating or non-inverting input to differential amplifier 30 is coupled to node A. Transistor 28 includes a first current electrode coupled to an output of differential amplifier 30, a second current electrode coupled to a negating or inverting input of differential amplifier 30, and a control electrode coupled to the CALIB signal. Capacitor 32 has a first terminal coupled to the second current electrode of transistor 28 and the negating input of differential amplifier 30, and a second terminal coupled to VSS, which may be at ground or other suitable voltage that is lower than supply voltage VDD.

Figure 3A:
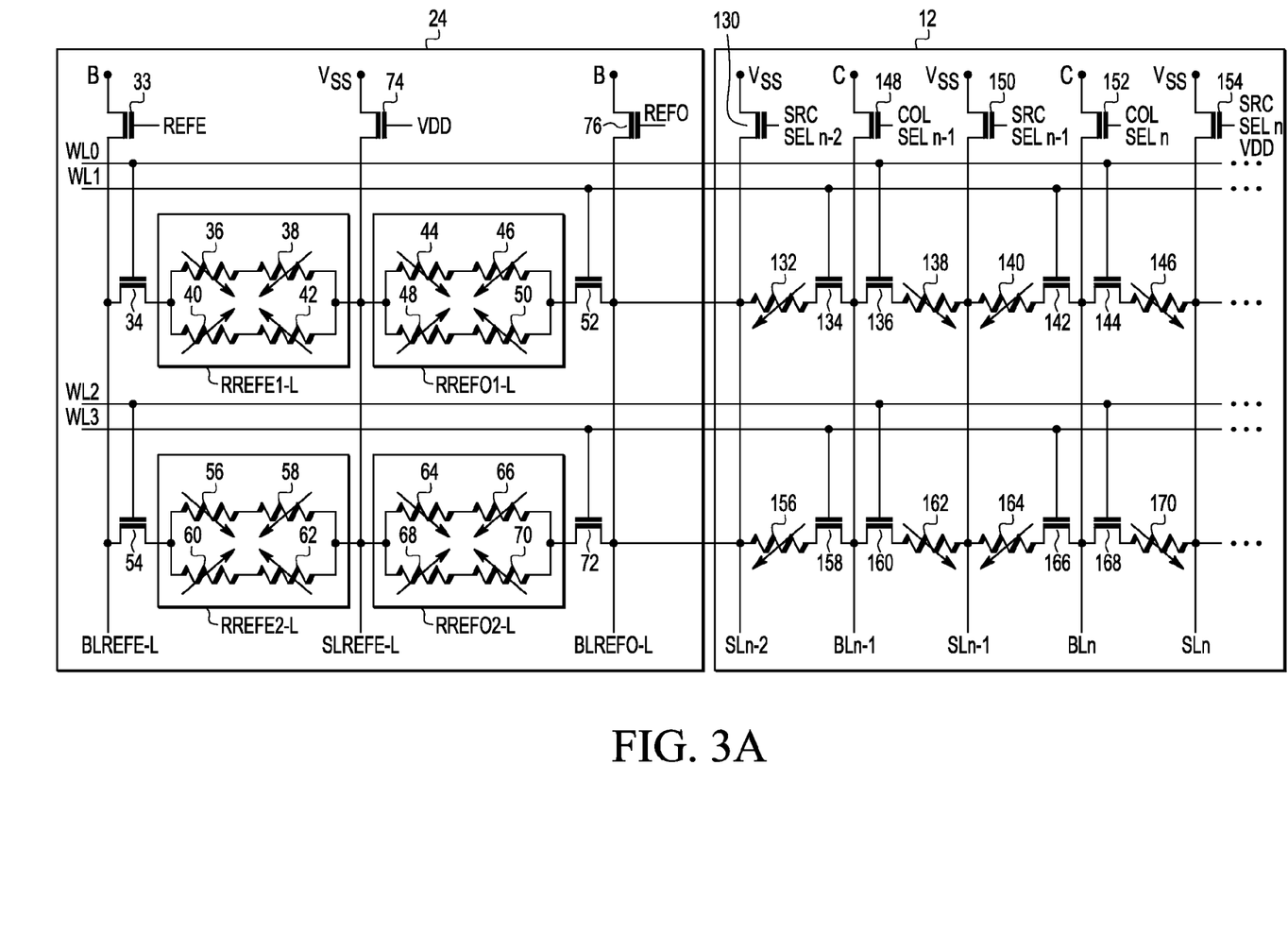
FIGS. 3A and 3B illustrate a circuit diagram of an embodiment of a portion of the memory array and sense amplifier shown in FIGS. 1 and 2.
Figure 3B:
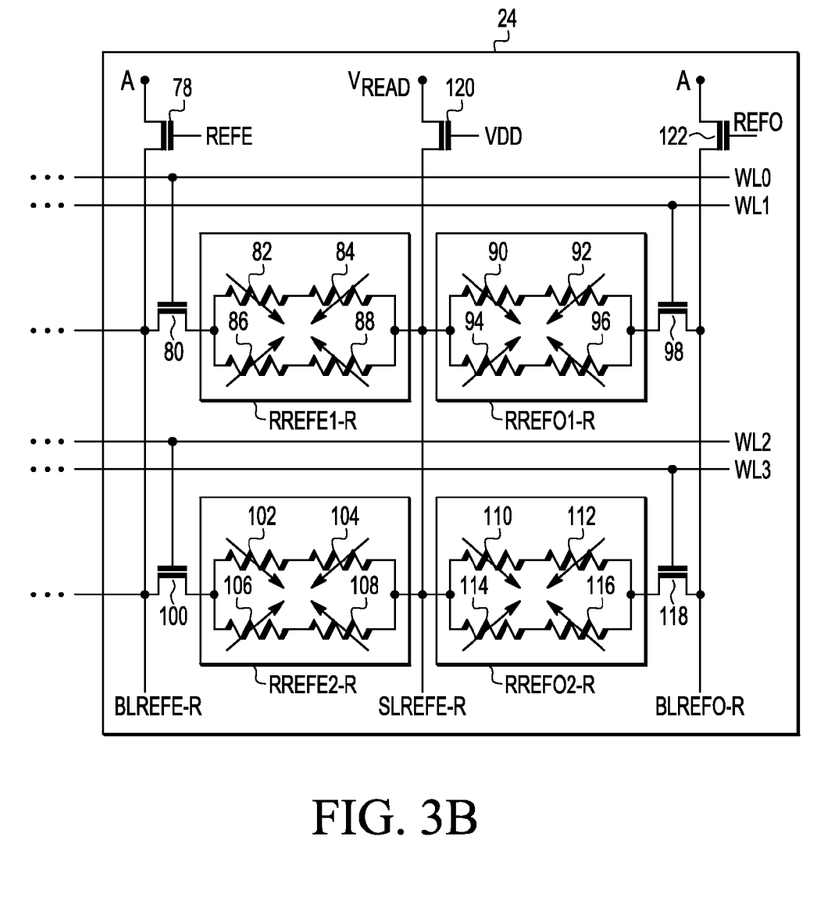

Node A is coupled to one of reference resistors RREFE1-R, RREFE2-R, RREFO1-R or RREFO2-R for both the calibration and sense modes of the sense amplifier 24 so voltage can be stored on capacitor 32 during the calibration mode and voltage can be sensed at node C during the sense mode. During a calibration mode of sense amplifier 24, CALIB signal is set to place transistors 25 and 28 in conductive mode allowing voltage at node B to be input at the non-negating input to differential amplifier 30. SENSE signal is set to place transistor 26 in non-conducting mode. As shown in FIGS. 3A AND 3B, node B is coupled to a reference resistor. The output of differential amplifier 30 is fed back to the negating input of differential amplifier, so the difference between the voltages at the non-negating input and the negating input represents the offset voltage generated by mismatched components of differential amplifier 30. The offset voltage is stored in capacitor 32 and is used to negate the effect of the offset voltage during a sense mode of sense amplifier 24.

During the sense mode, CALIB signal is set to place transistors 25 and 28 in non-conductive mode and SENSE signal is set to place transistor 26 in conducting mode allowing voltage at node C to be input at the non-negating input to differential amplifier 30. As shown in FIGS. 3A and 3B, node C is coupled to a bit line of one or more memory cells which is sensed during the sense mode of read operations. Voltage from capacitor 32 is applied at the negating input to differential amplifier 30, removing any offset present in differential amplifier 30 from the voltage sensed at node C. The output of differential amplifier 30 thus accurately represents the storage state of the selected memory cell because offset error is removed.

FIGS. 3A and 3B illustrate a circuit diagram of an embodiment of a portion of the memory array 12 and sense amplifier 24 shown in FIGS. 1 and 2. A first side (L) of sense amplifier 24 includes reference transistors 33, 74, 76, access transistors 34, 52, 54, 72, and four reference resistors (RREFE1-L, RREFO1-L, RREFE2-L, RREFO2-L). A second side (R) of sense amplifier 24 includes reference transistors 78, 120, 122, access transistors 80, 98, 100, 118, and four reference resistors (RREFE1-R, RREFO1-R, RREFE2-R, RREFO2-R).

Reference resistor RREFE1-L includes a first pair of resistive elements 36, 38 coupled in series and a second pair of resistive elements 40, 42 coupled in series. Resistive elements 36, 38 are coupled in parallel with resistive elements 40, 42.

Reference resistor RREFO1-L includes a first pair of resistive elements 44, 46 coupled in series and a second pair of resistive elements 48, 50 coupled in series. Resistive elements 44, 46 are coupled in parallel with resistive elements 48, 50. A second terminal of resistor RREFE1-L is coupled to a second terminal of resistor RREFO1-L.

Reference resistor RREFE2-L includes a first pair of resistive elements 56, 58 coupled in series and a second pair of resistive elements 60, 62 coupled in series. Resistive elements 56, 58 are coupled in parallel with resistive elements 60, 62.

Reference resistor RREFO2-L includes a first pair of resistive elements 64, 66 coupled in series and a second pair of resistive elements 68, 70 coupled in series. Resistive elements 64, 66 are coupled in parallel with resistive elements 68, 70.

Reference resistor RREFE1-R includes a first pair of resistive elements 82, 84 coupled in series and a second pair of resistive elements 86, 88 coupled in series. Resistive elements 82, 84 are coupled in parallel with resistive elements 86, 88.

Reference resistor RREFO1-R includes a first pair of resistive elements 90, 92 coupled in series and a second pair of resistive elements 94, 96 coupled in series. Resistive elements 90, 92 are coupled in parallel with resistive elements 94, 96. A second terminal of resistor RREFE1-R is coupled to a second terminal of resistor RREFO1-R.

Reference resistor RREFE2-R includes a first pair of resistive elements 102, 104 coupled in series and a second pair of resistive elements 106, 108 coupled in series. Resistive elements 102, 104 are coupled in parallel with resistive elements 106, 108.

Reference resistor RREFO2-R includes a first pair of resistive elements 110, 112 coupled in series and a second pair of resistive elements 114, 116 coupled in series. Resistive elements 110, 112 are coupled in parallel with resistive elements 114, 116.

Reference transistor 33 has a first current electrode coupled to node B, a second current electrode coupled to a reference bit line BLREFE-L, and a control electrode coupled to a first reference enable signal (REFE).

Reference transistor 74 has a first current electrode coupled to VSS or ground, a second current electrode coupled to a reference source line SLREF-L, and a control electrode coupled to supply voltage (VDD).

Reference transistor 76 has a first current electrode coupled to node B, a second current electrode coupled to a reference bit line BLREFO-L, and a control electrode coupled to a second reference enable signal (REFO).

Resistive elements 36, 38, 40, 42, 44, 46, 48, 50, 56, 58, 60, 62, 64, 66, 68, 70, 82, 84, 86, 88, 90, 92, 94, 96, 102, 104, 106, 108, 110, 112, 114, 116 can be implemented using spin transfer torque magnetic tunnel junction (STT MTJ) resistive elements. Each resistive element in the series-coupled pair of resistive elements 36/38, 40/42, 44/46, 48/50, 56/58, 60/62, 64/66, 68/70, 82/84, 86/88, 90/92, 94/96, 102/104, 106/108, 110/112, 114/116 are connected opposite one another so they are self-reinforcing and cannot be disturbed during a read operation. For example, for resistor RREFE1-L, resistive elements 36 and 40 are coupled to be in a high resistive state and resistive elements 38 and 42 are coupled to be in a low resistive state when current flows from node A to node B during calibration. For resistor RREFE1-R, resistive elements 82 and 86 are coupled to be in a low resistance state and resistive elements 84 and 88 are coupled to be in a high resistance state when current flows from node A to node C during the sense mode.

Alternatively, resistors RREFE1-L, RREFO1-L, RREFE2-L, RREFO2-L, can be implemented using one resistor instead of the serial/parallel combination of four resistive elements. The serial/parallel pairs of resistive elements 36/38, 40/42, 44/46, 48/50, 56/58, 60/62, 64/66, 68/70 in resistors RREFE1-L, RREFO1-L, RREFE2-L, RREFO2-L, provide an average resistance that is more likely to mitigate process variations than using just a single resistor alone, however.

Access transistor 34 has a first current electrode coupled to reference bit line BLREFE-L, a second current electrode coupled a terminal of reference resistor RREFE1-L, and a control electrode coupled to word line WL0.

Access transistor 52 has a first current electrode coupled to a second reference bit line BLREFO-L, a second current electrode coupled a terminal of reference resistor RREFO1-L, and a control electrode coupled to word line WL1.

Access transistor 54 has a first current electrode coupled to reference bit line BLREFE-L, a second current electrode coupled a terminal of reference resistor RREFE2-L, and a control electrode coupled to word line WL2.

Access transistor 72 has a first current electrode coupled to a second reference bit line BLREFO-L, a second current electrode coupled to a terminal of reference resistor RREFO2-L, and a control electrode coupled to word line WL3.

Reference transistor 78 has a first current electrode coupled to node A, a second current electrode coupled to a reference bit line BLREFE-R, and a control electrode coupled to a first reference enable signal (REFE).

Reference transistor 120 has a first current electrode coupled to a read voltage supply VREAD, a second current electrode coupled to a reference source line SLREF-R, and a control electrode coupled to supply voltage VDD.

Reference transistor 122 has a first current electrode coupled to node A, a second current electrode coupled to a reference bit line BLREFO-R, and a control electrode coupled to second reference enable signal (REFO).

Access transistor 80 has a first current electrode coupled to reference bit line BLREFE-R, a second current electrode coupled a terminal of reference resistor RREFE1-R, and a control electrode coupled to word line WL0.

Access transistor 98 has a first current electrode coupled to a second reference bit line BLREFO-R, a second current electrode coupled a terminal of reference resistor RREFO1-R, and a control electrode coupled to word line WL1.

Access transistor 100 has a first current electrode coupled to reference bit line BLREFE-R, a second current electrode coupled a terminal of reference resistor RREFE2-R, and a control electrode coupled to word line WL2.

Access transistor 118 has a first current electrode coupled to a second reference bit line BLREFO-R, a second current electrode coupled to a terminal of reference resistor RREFO2-R, and a control electrode coupled to word line WL3.

The portion of memory array 12 shown in FIGS. 3A AND 3B includes source line select transistors 130, 150 154 coupled to respective source lines SLN-2, SLN-1, SLN, and column or bit line select transistors 148, 152 coupled to respective bit lines BLN-1, BLN. Source line select transistor 130 includes a first current electrode coupled to supply voltage VSS or ground, a second current electrode coupled to source line SLN-2 and a control electrode coupled to a source line select signal SRC-SELN-2.

Source line select transistor 150 includes a first current electrode coupled to supply voltage VSS or ground, a second current electrode coupled to source line SLN-1 and a control electrode coupled to a source line select signal SRC-SELN-1.

Source line select transistor 154 includes a first current electrode coupled to supply voltage VSS or ground, a second current electrode coupled to source line SLN and a control electrode coupled to a source line select signal SRC-SELN.

Column select transistor 148 includes a first current electrode coupled to node C, a second current electrode coupled to bit line BLN-1 and a control electrode coupled to a column select signal COL-SELN-1.

Column select transistor 152 includes a first current electrode coupled to node C, a second current electrode coupled to bit line BLN and a control electrode coupled to a column select signal COL-SELN.

Memory array 12 includes four rows and four columns of bit or memory cells, with each bit cell including one resistive element and one transistor. A first bit cell includes resistive element 132 and transistor 134. Resistive element 132 has a first terminal coupled to source line SLN-2, and a second terminal coupled to a first current electrode of transistor 134. Transistor 134 further includes a second current electrode coupled to bit line BLN-1 and a control electrode coupled to word line WL1.

A second bit cell includes resistive element 138 and transistor 136. Resistive element 138 has a first terminal coupled to source line SLN-1, and a second terminal coupled to a first current electrode of transistor 136. Transistor 136 further includes a second current electrode coupled to bit line BLN-1 and a control electrode coupled to word line WL0.

A third bit cell includes resistive element 140 and transistor 142. Resistive element 140 has a first terminal coupled to source line SLN-1, and a second terminal coupled to a first current electrode of transistor 142. Transistor 142 further includes a second current electrode coupled to bit line BLN and a control electrode coupled to word line WL1.

A fourth bit cell includes resistive element 146 and transistor 144. Resistive element 146 has a first terminal coupled to source line SLN-1, and a second terminal coupled to a first current electrode of transistor 144. Transistor 144 further includes a second current electrode coupled to bit line BLN and a control electrode coupled to word line WL0.

A fifth bit cell includes resistive element 156 and transistor 158. Resistive element 156 has a first terminal coupled to source line SLN-2, and a second terminal coupled to a first current electrode of transistor 158. Transistor 158 further includes a second current electrode coupled to bit line BLN-1 and a control electrode coupled to word line WL3.

A sixth bit cell includes resistive element 160 and transistor 162. Resistive element 160 has a first terminal coupled to source line SLN-1, and a second terminal coupled to a first current electrode of transistor 162. Transistor 162 further includes a second current electrode coupled to bit line BLN-1 and a control electrode coupled to word line WL2.

A seventh bit cell includes resistive element 164 and transistor 166. Resistive element 164 has a first terminal coupled to source line SLN-1, and a second terminal coupled to a first current electrode of transistor 166. Transistor 166 further includes a second current electrode coupled to bit line BLN and a control electrode coupled to word line WL3.

An eighth bit cell includes resistive element 170 and transistor 168. Resistive element 170 has a first terminal coupled to source line SLN-1, and a second terminal coupled to a first current electrode of transistor 168. Transistor 168 further includes a second current electrode coupled to bit line BLN and a control electrode coupled to word line WL2.

Resistive elements 132, 138, 140, 146, 156, 162, 164, 170 can be implemented using STT MTJ resistors or other suitable non-volatile programmable resistive element capable of retaining a high or low resistance state until programmed to the opposite state. Although the portion of memory array 12 shown includes only eight memory cells, memory array 12 can include many more rows and columns of memory cells with additional bit lines, word lines, and source lines.

Figure 4:
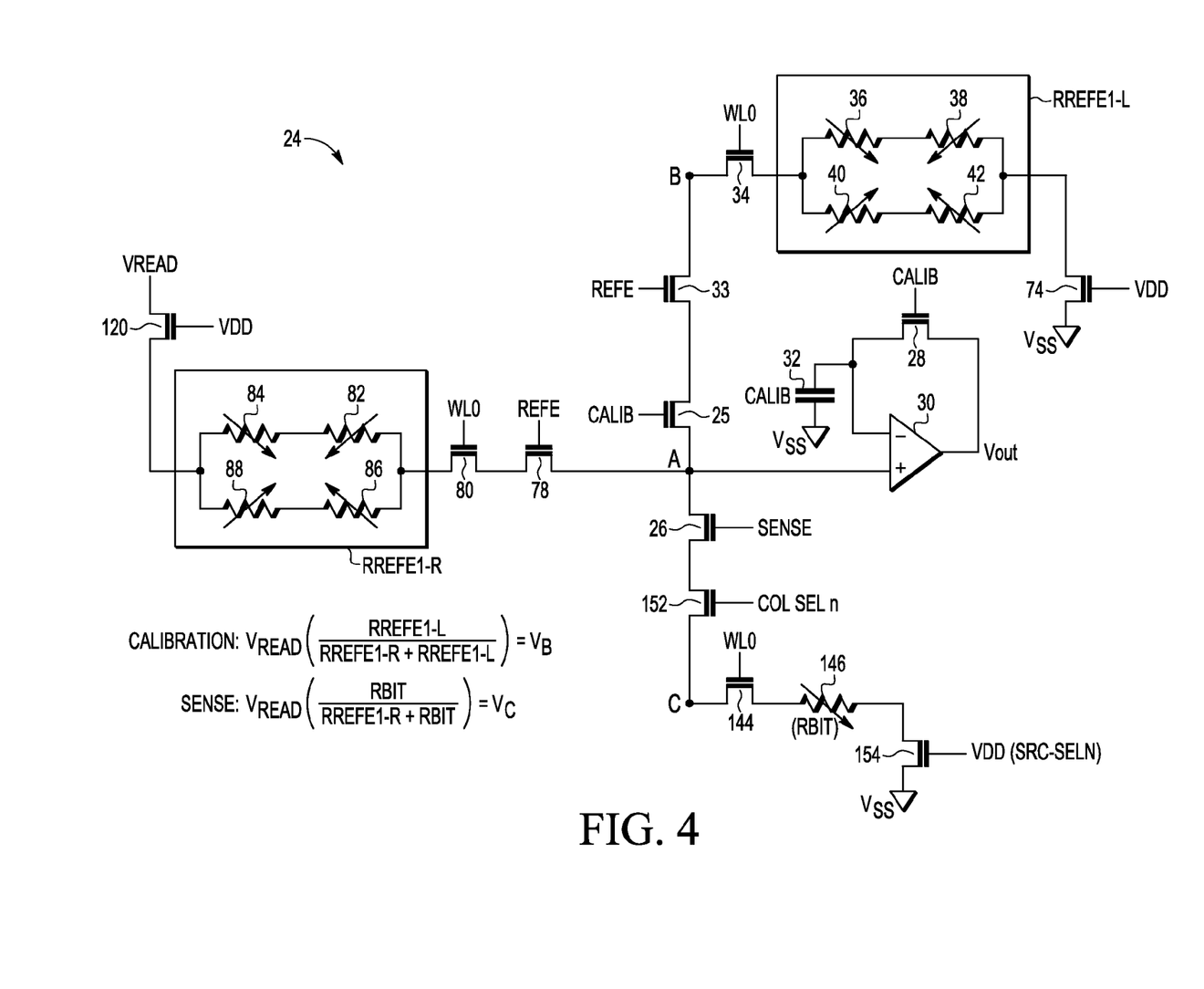
FIG. 4 illustrates a circuit diagram of a portion of an embodiment of the memory array and sense amplifier shown in FIGS. 2 and 3.
Figure 5:
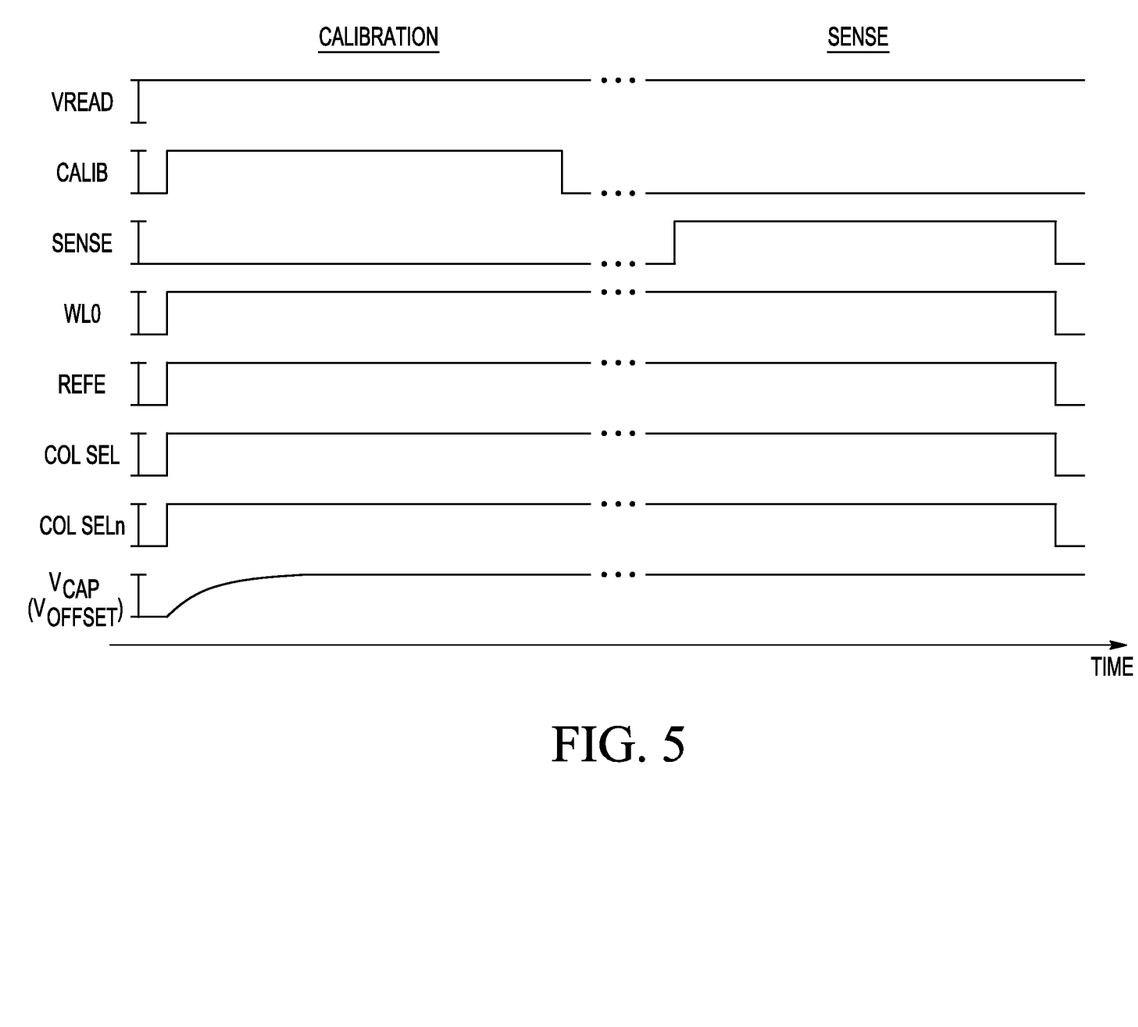
FIG. 5 illustrates an embodiment of a timing diagram for operating the RAM device of FIG. 1 during calibration and sensing modes.

Referring now to FIGS. 2, 3, 4, and 5, FIG. 4 illustrates a circuit diagram of a portion of an embodiment of the memory array and sense amplifier shown in FIGS. 2 and 3 as an example of components involved in sense amplifier 24 and memory array 12 during a read operation including calibration mode and sense mode of the fourth bit cell that includes transistor 144 and resistive element 146 is shown in FIG. 4. FIG. 5 illustrates an embodiment of a timing diagram showing states of various signals of the RAM device 10 of FIG. 1 during calibration and sensing modes of the read operation.

During the calibration mode, read voltage VREAD is high when the calibration enable signal CALIB, word line signal WL0, reference signal REFE, column select COL-SELn, and source line select SRC_SELn are set high. Sense enable signal SENSE is set low, causing voltage at the non-negating input of differential amplifier 30 to be equal to read voltage VREAD times the ratio of resistors (RREFE1-L/(RREFE1-R+RREFE1-L)) due to sense transistor 26 being in non-conductive mode. Since the output of differential amplifier 30 is based on the difference between voltages at the inputs to differential amplifier 30, any offset voltage error due to mismatch in components at the inputs to differential amplifier 30 is amplified and fed back to the negating input of differential amplifier 30 and is stored in capacitor 32.

During the sense mode, calibration enable signal CALIB is set low while read voltage VREAD, word line signal WL0, reference signal REFE, column select COL-SELn, and source line select signal SRC_SELn are high. When the sense enable signal SENSE is set high, voltage VC at the non-negating input of differential amplifier 30 is equal to read voltage VREAD times the ratio of resistors (RBIT/(RREFE1-R+RBIT)), where RBIT represents resistive element 146 in FIGS. 3 and 4, due to transistors 120, 80, 78, 26, 152, 144 and 154 being in conductive mode and transistor 25 being in non-conductive mode. Voltage at the negating input of differential amplifier is at the level attained during the calibration mode (i.e., voltage VB) due to capacitor 32 being pre-charged to the offset voltage as the state of the bit cell is sensed. Note that the feedback loop is open when transistor 28 is in non-conductive mode due to the calibration enable signal being low. If resistive element 146 is in a high resistance state (i.e., storing a "1"), voltage VC will be high and the output of differential amplifier 30 will be high. If resistive element 146 is in a low resistance state (i.e., storing a "0"), voltage VC will be low and the output of differential amplifier 30 will be low. Since the offset voltage error due to mismatch in components at the inputs to differential amplifier 30 is accounted for in the charge that is stored in capacitor 32 during the calibration mode, the voltage sensed at the output of differential amplifier 30 at the beginning of the sense mode is accurate.

By now it should be appreciated that there has been disclosed a non-volatile memory device with sense amplifiers that accurately sense voltage on bit lines instead of current, thus avoiding inaccuracies found in current mirrors used in conventional sense amplifiers. Sense amplifier 24 creates no read disturbance of the reference bit lines BLREFE-L, BLREFO-L, BLREFE-R and BLREFO-R due to the configuration of resistors RREFE1-L, RREFO1-L, RREFE2-L, RREFO2-L, RREFE1-R, RREFO1-R, RREFE2-R, RREFO2-R. Additionally, resistors RREFE1-L, RREFO1-L, RREFE2-L, RREFO2-L, RREFE1-R, RREFO1-R, RREFE2-R, RREFO2-R will have their states reinforced irrespective of whether the resistive elements are in a high resistance state or a low resistance state. The reference bit lines BLREFE-L, BLREFO-L, BLREFE-R and BLREFO-R will have all the same effects bit lines BLN-1 and BLN in the array 12 to provide as close a tracking as possible for couplings and other array effects. The effective reference resistance at high resistance state and low resistance state divided by 2 in reference resistors RREFE1-L, RREFO1-L, RREFE2-L, RREFO2-L, RREFE1-R, RREFO1-R, RREFE2-R, RREFO2-R provides a mid-point placement of reference resistance relative to the high and low resistance states.

In some embodiments, a method uses a memory (10) that includes a plurality of non-volatile memory (NVM) cells; a plurality of word lines (WL0, WL1); a plurality of bit lines (BLn, BLn-1); and an amplifier (30) having an inverting input, a non-inverting input, and an output; and a capacitance (32) coupled to the inverting input includes. A reference (Rref/Rcom×Vread) is coupled to the non-inverting input. The output of the amplifier is coupled to the inverting input of the amplifier while the non-inverting input receives the reference. The output is decoupled from the inverting input to store a voltage on the inverting input of the amplifier. A non-volatile (NV) element (140) of a first NVM cell (140 and 142) of the plurality of NVM cells is coupled to the non-inverting input. An output signal (Vout) representative of the state of the NVM cell is provided.

In another aspect, the decoupling the output is further characterized by the voltage on the inverting input of the amplifier being equal to the magnitude the reference plus an offset of the amplifier.

In another aspect, the coupling of the output of the amplifier is performed in response to a calibration signal (CALIB).

In another aspect, the coupling the reference is further characterized by the reference providing a voltage representative of an average of a logic high and a logic low of the NVM cells.

In another aspect, the coupling the reference is further characterized by the reference comprising a first pair of series-connected non-volatile (NV) elements (36, 38) programmed to opposite logic states in parallel with a second pair of series-connected NV elements (40, 42) programmed to opposite logic states.

In another aspect, the coupling the reference is further characterized by the first and second pair of series connected NV elements that are in parallel are coupled between a first power supply terminal and the inverting input.

In another aspect, the coupling the reference further comprises coupling a load between a second power supply terminal and the non-inverting input.

In another aspect, the coupling the reference is further characterized by the load comprising a third pair of series-connected NV elements (84, 82) programmed to opposite logic states in parallel with a fourth pair of series-connected NV elements (88, 86) programmed to opposite logic states.

In another aspect, the method can further comprise decoupling the first and second pair of series-connected NV elements from the non-inverting input prior to the coupling the NV element of the first NVM cell to the non-inverting input of the amplifier, wherein the load is coupled to the non-inverting input during the coupling the NV element of the first NVM cell to the non-inverting input of the amplifier.

In another aspect, the coupling the NV element of the first NVM cell to the non-inverting input of the amplifier comprises coupling the NV element of the first NVM cell to a first bit line of the plurality of bit lines and coupling the first bit line to the non-inverting input.

In another embodiment, a memory (124, 126) can comprise a plurality of word lines (WL0,1); a plurality of source lines (SLn); a plurality of bit lines (BLn); and an array (12) of comprising a plurality of non-volatile memory (NVM) cells (140+142) and a plurality of reference circuits (90+92+94+96+98). A first NVM cell of the plurality of NVM cells can comprise a first non-volatile (NV) element (144) and a coupling device (146), wherein the coupling device is coupled to a first bit line (BLn) of the plurality of bit lines, a first word line (WL0) of the plurality of word lines, and to the first NV element and wherein the first NV element is coupled to a first source line of the plurality of source lines. A first reference circuit of the plurality of reference circuits can comprise a first pair of series-connected NV elements programmed to opposite logic states in parallel with a second pair of series connected NV elements programmed to opposite logic states. An amplifier in the memory can have an inverting input; a non-inverting input; an output; and a capacitance coupled to the inverting input in which: in a calibration mode, the amplifier receives a reference voltage on the non-inverting input from the first reference circuit while the output is coupled to the inverting input and decouples the output from the inverting input in response to termination of the calibration mode whereby a reference is established on the inverting input; and in a sensing mode in which a logic state of the first NV element is to be read, the non-inverting input is coupled to the first NV element.

In another aspect, in the sensing mode, the first source line is coupled to a first power supply terminal.

In another aspect, in the calibration mode, the first reference circuit is coupled between the first power supply terminal and the non-inverting input.

In another aspect, the second power supply terminal is for a positive voltage and the first power supply terminal is for ground.

In another aspect, the memory can further comprise a load coupled between a second power supply terminal and the non-inverting input in the calibration mode and in the sensing mode.

In another aspect, the load comprises a third pair of series-connected NV elements programmed to opposite logic states in parallel with a fourth pair of series-connected NV elements programmed to opposite logic states.

In another aspect, further comprising a transistor that couples the first bit line to the non-inverting input during the read mode.

In another embodiment, a method of operating a memory (NVM) (10), wherein the memory comprises a plurality of non-volatile memory (NVM) cells each having a non-volatile (NV) element; a plurality of word lines (WL0, WL1); a plurality of bit lines (BLn, BLn-1); and an amplifier (30) having an inverting input, a non-inverting input, and an output; and a capacitance (32) coupled to the inverting input, wherein the amplifier is characterized as having an offset, the method can comprise performing a calibration by: applying a reference to the non-inverting input; coupling the output of the amplifier to the inverting input during the applying the reference to the non-inverting input; and decoupling the output of the amplifier from the inverting input after establishing an offset-compensated reference on the inverting input. A read of a selected NVM cell can be performed by: decoupling the reference from the non-inverting input; selecting an NVM cell; coupling the non-inverting input to the NV element of the selected NVM cell; and providing an output signal on the output representative of a logic state of the NV element.

In another aspect, the applying the reference is further characterized by the reference being applied by a first circuit comprising a first pair of series-connected non-volatile (NV) elements (36, 38) programmed to opposite logic states in parallel with a second pair of series-connected NV elements (40, 42) programmed to opposite logic states, wherein the first circuit is coupled between the non-inverting input and a first power supply terminal.

In another aspect, the applying the reference is further characterized by the reference further being applied by a second circuit comprising a third pair of series-connected NV elements (84, 82) programmed to opposite logic states in parallel with a fourth pair of series-connected NV elements (88, 86) programmed to opposite logic states, wherein the second circuit is coupled between the non-inverting input and a second power supply terminal.

Although the invention is described herein with reference to specific embodiments, various modifications and changes can be made without departing from the scope of the present invention as set forth in the claims below. For example, the particular type of non-volatile resistive element can vary from that disclosed. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method of operating a memory, wherein the memory comprises a plurality of non-volatile memory (NVM) cells; a plurality of word lines; a plurality of bit lines; and an amplifier having an inverting input, a non-inverting input, and an output; and a capacitance coupled to the inverting input, the method comprising:
    generating a reference having a magnitude using reference circuitry that includes a first portion and a second portion;
    coupling the reference to the non-inverting input;
    during a calibration operation:
        coupling the output of the amplifier to the inverting input of the amplifier while the reference is coupled to the non-inverting input; and
        decoupling the output from the inverting input whereby a voltage is stored on the inverting input of the amplifier;
    during a sense operation:
        coupling the first portion to the non-inverting input to the amplifier to provide a load;
        decoupling the second portion from the non-inverting input to the amplifier;
        coupling a non-volatile (NV) element of a first NVM cell of the plurality of NVM cells to the non-inverting input; and
        providing an output signal representative of a logic state of the NVM cell.

2. The method of claim 1, wherein the decoupling the output is further characterized by the voltage on the inverting input of the amplifier being equal to the magnitude the reference plus an offset of the amplifier.

3. The method of claim 2, wherein the coupling of the output of the amplifier is performed in response to a calibration signal.

4. The method of claim 1, wherein the coupling the reference is further characterized by the reference providing a voltage representative of an average of a logic high and a logic low of the NVM cells.

5. The method of claim 1, wherein the first portion of the reference circuitry comprises a first pair of series-connected NV elements programmed to opposite logic states in parallel with a second pair of series-connected NV elements programmed to opposite logic states.

6. The method of claim 5, wherein the reference circuitry is further characterized by the first and second pair of series connected NV elements that are in parallel are coupled between a first power supply terminal and the inverting input.

7. The method of claim 6, wherein the coupling the reference further comprises coupling the load between a second power supply terminal and the non-inverting input.

8. The method of claim 7, wherein the reference circuitry is further characterized by the second portion comprising a third pair of series-connected NV elements programmed to opposite logic states in parallel with a fourth pair of series-connected NV elements programmed to opposite logic states.

9. The method of claim 8, further comprising decoupling the first and second pair of series-connected NV elements from the non-inverting input prior to the coupling the NV element of the first NVM cell to the non-inverting input of the amplifier, wherein the load is coupled to the non-inverting input during the coupling the NV element of the first NVM cell to the non-inverting input of the amplifier.

10. The method of claim 1, wherein the coupling the NV element of the first NVM cell to the non-inverting input of the amplifier comprises coupling the NV element of the first NVM cell to a first bit line of the plurality of bit lines and coupling the first bit line to the non-inverting input.

11. A memory, comprising:
a plurality of word lines;
a plurality of source lines;
a plurality of bit lines; and
an array of comprising a plurality of non-volatile memory (NVM) cells and a plurality of reference circuits, wherein:
  a first NVM cell of the plurality of NVM cells comprises a first non-volatile (NV) element and a coupling device, wherein the coupling device is coupled to a first bit line of the plurality of bit lines, a first word line of the plurality of word lines, and to the first NV element and wherein the first NV element is coupled to a first source line of the plurality of source lines; and
  a first reference circuit of the plurality of reference circuits comprises a first pair of series-connected NV elements programmed to opposite logic states in parallel with a second pair of series connected NV elements programmed to opposite logic states;
an amplifier having an inverting input; a non-inverting input; an output; and a capacitance coupled to the inverting input in which:
  in a calibration mode, the amplifier receives a reference voltage on the non-inverting input from the first reference circuit while the output is coupled to the inverting input and decouples the output from the inverting input in response to termination of the calibration mode whereby a reference is established on the inverting input; and
  in a sensing mode in which a logic state of the first NV element is to be read, the non-inverting input is coupled to the first NV element and the first reference circuit is decoupled from the non-inverting input; and
a load coupled between a second power supply terminal and the non-inverting input in both the calibration mode and the sensing mode.

12. The memory of claim 11, wherein, in the sensing mode, the first source line is coupled to a first power supply terminal.

13. The memory of claim 12, wherein, in the calibration mode, the first reference circuit is coupled between the first power supply terminal and the non-inverting input.

14. The method of claim 13, wherein the second power supply terminal is for a positive voltage and the first power supply terminal is for ground.

15. The memory of claim 14, wherein the load comprises a third pair of series-connected NV elements programmed to opposite logic states in parallel with a fourth pair of series-connected NV elements programmed to opposite logic states.

16. The memory of claim 11, further comprising a transistor that couples the first bit line to the non-inverting input during the read mode.

17. A method of operating a non-volatile memory (NVM), wherein the NVM comprises a plurality of NVM cells each having a non-volatile (NV) element; a plurality of word lines; a plurality of bit lines; and an amplifier having an inverting input, a non-inverting input, and an output; and a capacitance coupled to the inverting input, wherein the amplifier is characterized as having an offset, the method comprising:
performing a calibration by:
  applying a reference and a load to the non-inverting input;
  coupling the output of the amplifier to the inverting input during the applying the reference to the non-inverting input; and
  decoupling the output of the amplifier from the inverting input after establishing an offset-compensated reference on the inverting input; and
performing a read of a selected NVM cell by:
  decoupling the reference from the non-inverting input while the load remains coupled to the non-inverting input;
  selecting an NVM cell;
  coupling the non-inverting input to the NV element of the selected NVM cell; and
  providing an output signal on the output representative of a logic state of the NV element.

18. The method of claim 17, wherein the applying the reference is further characterized by the reference being applied by a first circuit comprising a first pair of series-connected NV elements programmed to opposite logic states in parallel with a second pair of series-connected NV elements programmed to opposite logic states, wherein the first circuit is coupled between the non-inverting input and a first power supply terminal.

19. The method of claim 18, wherein the applying the load is further characterized by the load further being applied by a second circuit comprising a third pair of series-connected NV elements programmed to opposite logic states in parallel with a fourth pair of series-connected NV elements programmed to opposite logic states, wherein the second circuit is coupled between the non-inverting input and a second power supply terminal.

* * * * *